US006859918B2

(12) United States Patent
Ma et al.

(10) Patent No.: US 6,859,918 B2
(45) Date of Patent: Feb. 22, 2005

(54) ALLEVIATING LINE END SHORTENING BY EXTENDING PHASE SHIFTERS

(75) Inventors: Melody W. Ma, San Jose, CA (US); Hua-Yu Liu, Palo Alto, CA (US)

(73) Assignee: Numerical Technologies, San Jose, CA (US)

(*) Notice: Subject to any disclaimer, the term of this patent is extended or adjusted under 35 U.S.C. 154(b) by 69 days.

(21) Appl. No.: 10/313,325

(22) Filed: Dec. 6, 2002

(65) Prior Publication Data
US 2003/0066038 A1 Apr. 3, 2003

Related U.S. Application Data

(63) Continuation of application No. 09/872,620, filed on May 31, 2001, now Pat. No. 6,553,560
(60) Provisional application No. 60/281,325, filed on Apr. 3, 2001.

(51) Int. Cl.[7] ............................................. G06F 17/50
(52) U.S. Cl. .......................................... 716/19; 716/21
(58) Field of Search ......................... 716/19–21; 430/5

(56) References Cited

U.S. PATENT DOCUMENTS

| | | | |
|---|---|---|---|
| 4,456,371 A | 6/1984 | Lin | 355/71 |
| 5,302,477 A | 4/1994 | Dao et al. | 430/5 |
| 5,308,741 A | 5/1994 | Kemp | 430/312 |
| 5,316,878 A | 5/1994 | Saito et al. | 430/5 |
| 5,324,600 A | 6/1994 | Jinbo et al. | 430/5 |
| 5,328,807 A | 7/1994 | Tanaka et al. | 430/311 |
| 5,352,550 A | 10/1994 | Okamoto | 430/5 |
| 5,364,716 A | 11/1994 | Nakagawa et al. | 430/5 |
| 5,424,154 A | 6/1995 | Borodovsky | 430/5 |
| 5,472,814 A | 12/1995 | Lin | 430/5 |
| 5,498,579 A | 3/1996 | Borodovsky et al. | 437/250 |

(List continued on next page.)

FOREIGN PATENT DOCUMENTS

| | | |
|---|---|---|
| DE | 195 45 163 A1 | 6/1996 |
| EP | 0 653 679 A2 | 5/1995 |
| EP | 0 698 821 A1 | 2/1996 |
| GB | 2333613 A | 7/1999 |
| JP | 62067547 | 3/1987 |
| JP | 2-140743 | 5/1990 |
| JP | 1.283.925 | 2/1991 |
| JP | 6-67403 | 3/1994 |
| JP | 8.051.068 | 2/1996 |
| JP | 8-236317 | 9/1996 |
| JP | 2.638561 | 4/1997 |
| JP | 2.650.962 | 5/1997 |
| JP | 10-133356 | 5/1998 |
| JP | 11-143085 | 5/1999 |
| WO | WO 98/12605 A1 | 3/1998 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Fukuda, H., et al., "Determination of High–Order Lens Aberration Using Phase/Amplitude Linear Algebra". J. Vac. Sci. Technol. B, vol. 17, No. 6. pp. 3318–3321, Nov./Dec. 1999.

(List continued on next page.)

Primary Examiner—Vuthe Siek
Assistant Examiner—Paul Dinh
(74) Attorney, Agent, or Firm—Park, Vaughan & Fleming LLP

(57) ABSTRACT

One embodiment of the invention provides a system and a method for reducing line end shortening during an optical lithography process for manufacturing an integrated circuit. The system operates by receiving a specification of the integrated circuit, wherein the specification defines transistors that include gates. Next, the system identifies a gate within the specification, wherein the gate includes an endcap that is susceptible to line end shortening during the optical lithography process. The system then extends a phase shifter used to form the gate, so that the phase shifter defines at least a portion of the endcap and thereby reduces line end shortening of the endcap due to optical effects.

18 Claims, 6 Drawing Sheets

U.S. PATENT DOCUMENTS

| | | | |
|---|---|---|---|
| 5,503,951 A | 4/1996 | Flanders et al. | 430/5 |
| 5,523,186 A | 6/1996 | Lin et al. | 430/5 |
| 5,527,645 A | 6/1996 | Pati et al. | 430/5 |
| 5,532,090 A | 7/1996 | Borodovsky | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,635,316 A | 6/1997 | Dao | 430/5 |
| 5,636,131 A | 6/1997 | Liebmann et al. | 364/490 |
| 5,702,848 A | 12/1997 | Spence | 430/5 |
| 5,725,969 A | 3/1998 | Lee | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A | 9/1998 | Liebmann et al. | 430/5 |
| 5,827,623 A | 10/1998 | Ishida et al. | 430/5 |
| 5,858,580 A | 1/1999 | Wang et al. | 430/5 |
| 5,885,734 A | 3/1999 | Pierrat et al. | 430/5 |
| 5,923,562 A | 7/1999 | Liebmann et al. | 364/488 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,004,702 A | 12/1999 | Lin | 430/5 |
| 6,010,807 A | 1/2000 | Lin | 430/5 |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,189,136 B1 | 2/2001 | Bothra | 716/21 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 6,470,489 B1 * | 10/2002 | Chang et al. | 716/21 |
| 6,524,752 B1 * | 2/2003 | Pierrat | 430/5 |
| 2001/0000240 A1 | 4/2001 | Wang et al. | 430/5 |
| 2001/0028985 A1 | 10/2001 | Wang et al. | 430/5 |
| 2002/0083410 A1 | 6/2002 | Wu et al. | 716/19 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

OTHER PUBLICATIONS

Fukuda, H., "Node–Connection/Quantum Phase–Shifting Mask: Path to Below 0.3um Pitch, Proximity Effect Free, Random Interconnects and Memory Patterning", J. Vac. Sci. Technol. B, vol. 17, No. 6, pp. 3291–3295, Nov./Dec. 1999.

Spence, C.., et al., "Integration of Optical Proximity Correction Strategies in Strong Phase Shifters Design for Poly–Gate Layers", Bacus News, vol. 15, Issue 12, pp. 1, Dec. 4–13, 1999.

Kuo, C., et al., "Extension of Deep–Ultraviolet Lithography for Patterning Logic Gates Using Alternating Phase Shifting Masks", J. Vac. Sci. Technol. B, vol. 17, No. 6, pp. 3296–3300, Nov./Dec. 1999.

Palmer, S., et al., "Dual Mask Model–Based Proximity Correction for High Performance 0.10um CMOS Process", The 44th Int'l Conference on Electron, Ion & Photon Beam Tech. and Nanofabrication Abstracts, pp. 18–19, May 30–Jun. 2, 2000.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alt–PSMs". Optical Microlithography XIII, Proceeding of SPIE, vol. 4000, pp. 121–131 (2000).

Cooke, M., "OPC/PSM Designs For Poly Gate Layers", European Semiconductor, vol. 22, No. 7, pp. 57–59, Jul. 2000.

Granik, Y., et al., "Sub–Resolution Process Windows And Yield Estimation Technqiue Based On Detailed Full–Chip CD Simulation", SPIE, vol. 4182, pp. 335–341 (2000).

Plat, M., et al., "The Impact of Optical Enhancement Techniques on the Mask Error Enhancement Funchtion (MEEF)", SPIE, vol. 4000, pp. 206–214, Mar. 1–3, 2000.

Mansuripur, M., et al., "Projection Photolithography", Optics & Photonics News 11, 17 pages, Feb. 2000.

Cote, M., et al., "A Practical Application of Full–Feature Alternating Phase–Shifting Technology for a Phase–Aware Standard–Cell Design Flow", Numerical Technologies Inc. (6 pages).

Heng, F., et al., "Application of Automated Design Migration to Alternating Phase Sifht Mask Design", IBM Research Report RC 21978 (98769). Feb. 26, 2001 (7 pages).

Wong, A., et al., "Alternating Phase–Shifting Mask with Reduced Aberration Sensitivity: Lithography Considerations", Proc. SPIE, vol. 4346, pp. 1–9 (2001).

Nagahiro, Y., "Improved Mask Technique for Photolithography Applied to 0.25um LSI—Improvement of Resolution, Pattern Correction, Exposure Area", Nikkei Microdevices, pp. 1–6, Apr. 1995.

Okamoto, Y., et al., "A New Phase Shifting Mask Technology for Quarter Micron Photolithography", SPIE, vol. 2512, pp. 311–318 (1995).

Pierrat, C., et al., "Required Optical Characteristics of Materials for Phase–Shifting Masks", Applied Optics, vol. 34, No. 22, pp. 4923–4928, Aug. 1, 1995.

Galan, G., et al., "Alternating Phase Shift Generation for Coplex Circuit Designs", SPIE, vol. 2884, pp. 508–519, Sep. 18–20, 1996.

Kanai, H., et al., "Sub–Quarter Micron Lithography with the Dual–Trench Type Alternating PSM", SPIE, vol. 2793, pp. 165–173 (1996).

Ishiwata, N., et al., "Novel Alternating Phase Shift Mask with Improved Phase Accuracy", SPIE, Proceedings Of the 17th Annual Symposium On Photomask Technology And Management, vol. 3236, pp. 243–249 (1997).

Morimoto, H., et al., "Next Generation Mask Strategy—Technologies are Ready for Mass Production of 256MDRAM?", SPIE, vol. 3236, pp. 188–189 (1997).

Roman, B., et al., "Implication of Device Processing on Photomask CD Requirements", SPIE, vol. 3236 (1997) (Abstract Only).

Nakae, A., et al., "A Proposal for Pattern Layout Rule in Application of Alternating Phase Shift Mask", SPIE, vol. 3096, pp. 362–374 (1997).

Tsujimoto, E., et al., "Hierarchical Mask Data Design System (PROPHET) for Aerial Image Simulation, Automatic Phase–Shifter Placement, and Subspeak Overlap Checking", SPIE, vol. 3096, pp. 163–172 (1997).

Yamamoto, K., et al., "Hierarchical Processing of Levenson–Type Phase Shifter Generation", Jpn. J. Appl. Phys., vol. 36, Part 1, No. 12B, pp. 7499–7503, Dec. 1997.

Gordon, R., et al., "Design and Analysis of Manufacturable Alternating Phase–Shifting Masks", Bacus News vol. 14, Issue 12, pp. 1–9, Dec. 1998.

Nara, M., et al., "Phase Controllability Improvement for Alternating Phase Shift Mask", Dai Nippon Printing Co., Ltd. (16 pages).

Ohnuma, H., et al., "Lithography Computer Aided Design Technology for Embedded Memory in Logic", Jpn. J. Appl. Phys., vol. 37, Part I. No. 12B, pp. 6686–6688, Dec. 1998.

Ohtsuka, H., et al., "Evaluation of Repair Phase and Size Tolerance for a Phase–Shift Mask", J. Vac. Sci. Technol. B, vol. 11, No. 6, pp. 2665–2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2–16 (1993).

Galan, G., et al., "Application of Alternating–Type Phase Shift Mask to Polysilicon Level for Random Logic Circuits", Jpn. J. Appl. Phys., vol. 33, pp. 6779–6784 (1994).

Mizuno, F., et al., "Practical Phase–Shifting Mask Technology for 0.3um Large Scale Integrations", J. Vac. Sci. Technol. B, vol. 12, No. 6, pp. 3799–3803, Nov./Dec. 1994.

Nistler, J., et al., "Large Area Optical Design Rule Checker for Logic PSM Application", SPIE, Photomask And X–Ray Mask Technology, vol. 2254, pp. 78–92 (1994).

Pati. Y.C., et al., "Phase–Shifting Masks for Microlithography: Automated Design and Mask Requirements", J. Opt. Soc. Am., vol. 11, No. 9, pp. 2438–2452, Sep. ,1994.

Pierrat, C., et al., "A Rule–Based Approach to E–Beam and Process–Induced Proximity Effect Correction for Phase–Shifting Mask Fabrication", SPIE, vol. 2194, pp. 298–309 (1994).

Spence, C., et al., "Automated Determination of CAD Layout Failures Through Focus: Experiment and Simulation", SPIE, vol. 2197, pp. 302–313 (1994).

Stirniman, J., et al., "Wafer Proximity Correction and Its Impact on Mask–Making", Bacus News, vol. 10, Issue 1, pp. 1, 3–7, 10–12, Jan. 1994.

Waas, T., et al., "Automatic Generation of Phase Shift Mask Layouts", Microelectronic Engineering, vol. 23, pp. 139–142 (1994).

Barouch, E., et al., "OPTIMASK: An OPC Algorithm for Chrome and Phase–Shift Mask Design", SPIE, Vo. 2440, pp. 192–206, Feb. 1995.

Karklin, L., "A Comprehensive Simulation Study of the Photomask Defects Printability", SPiE, vol. 2621, pp. 490–504 (1995).

Moniwa, A., et al., "Heuristic Method for Phase–Conflict Minimization in Automatic Phase–Shift Mask Design", Jpn. J. Appl. Phys., vol. 34, Pt. 1, No. 12B, pp. 6584–6589, Dec. 1995.

Langston, J., et al., "Extending Optical Lithography to 0.25um and Below", Solid State Technology, pp. 57–64, Mar. 1995.

Jinbo, H., et al., "Application of Blind Method to Phase–Shifting Lithography", IEEE, 1992 Symposium On VLSI Technology Digest Of Technical Papers, pp. 112–113 (1992).

Ohtsukn, H., et al., "Phase Defect Repair Method for Alternating Phase Shift Masks Conjugate Twin–Shifter Method", Jpn. J. Appl. Phys., vol. 31, pp. 4143–4149 (1992).

Pierrat, C., et al., "Phase–Shifting Mask Topography Effects on Lithographic Image Quality", IEEE, pp. 3.3.1–3.3.4 (1992).

Watanabe, H., et al., "Detection and Printability of Shifter Defects in Phase–Shifting Masks II Defocus Characteristics", Jpn. J. Appl. Phys., vol. 31, pp. 4155–4160 (1992).

Burggraaf, P., "Lithography's Leading Edge, Part I: Phase–Shift Technology and Part 2: 1–Line and Beyond", Semiconductor International, pp. 43–47 and 52–56, Feb. 1992.

IBM, "Phase–Shift Mask Utilizing Silicon Oxy–Nitride as a Low Reflectivity Phase–Shift Layer", IBM Technical Disclosure Bulletin, vol. 34, No. 10B, pp. 360–361, Mar. 1992.

Brunner, T., et al., "170nm Gates Fabricated by Phase–Shift Mask and Top Anti–Reflector Process", SPIE, Optical/Laser Microlithography VI, Vo. 1927, pp. 182–189 (1993).

Brunner, T., "Rim Phase–Shift Mask Combined with Off–Axis Illumination: A Path to 0.5(lampda) / Numerical Aperture Geometries", Optical Engineering, vol. 32, No. 10, pp. 2337–2343, Oct. 1993.

Lin, B.J., "Phase–Shifting Masks Gain an Edge", IEEE Circuits & Devices, pp. 28–35, Mar. 1993.

Liu, H.Y., et al., "Fabrication of 0.1um T–Shaped Gates by Phase–Shifting Optical Lithography", SPIE, Optical/Laser Microlithography VI, vol. 1927, pp. 42–52 (1993).

Nistler, J., et al., "Phase Shift Mask Defect Printability Analysis", Proceedings Of The Microlithography Seminar INTERFACE '93. OCG Microelectronic Materials, Inc., pp. 11–28 (1993).

Rieger, M., et al., "System for Lithography Proximity Compensation", Precim Company, Portland, Oregon, Sep. 1993 (28 pages).

Moniwa, A., et al., "Algorithm for Phase–Shift Mask Design with Priority on Shifter Placement", Jpn. J. Appl. Phys., vol. 32, Pt. 1, No. 12B, pp. 5874–5879, Dec. 1193.

Ooi, K., et al., "Computer Aided Design Software for Designing Phase–Shifting Masks", Jpn. J. Appl. Phys., vol. 32, Pt. 1, No. 12B, pp. 5887–5891, Dec. 1993.

Jinbo, H., et al., "Improvement of Phase–Shifter Edge Line Mask Method", Japanese Journal Of Applied Physics, vol. 30, No. 11B, pp. 2998–3003, Nov. 1991.

Kimura, T., et al., "Subhalf–Micron Gate GaAs Mesfet Process Using Phase–Shifting–Mask Technology", IEEE, GaAs IC Symposium, pp. 281–284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346–355 (1991).

Hirai, Y., et al., "Automatic Pattern Generation System for Phase Shfiting Mask", 1991 Symposium on VLSI Technology, Digest of Technical Papers, pp. 95–96, May 28–30, 1991.

Wong, A., et al., "Investigating Phase–Shifting Mask Layout Issues Using a Cad Toolkit", IEEE, pp. 27.4.1–27.4.4 (1991).

Terasawa, T., et al., "Imaging Characteristics of Multi-Phase-Shifting and Halftone Phase-Shifting Masks", Japanese Journal of Applied Physics, vol. 30, No. 11B, pp. 2991–2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67–75, Oct. 14–15, 1991.

Newmark, D., et al., "Phase–Shifting Mask Design Tool", SPIE—11th Annual BACUS Symposium on Photmask Technology, vol. 1604, pp. 226–235, Sep. 25–27, 1991.

Nolscher, C., et al., "Investigation of Self–Aligned Phase–Shifting Reticles by Simulation Techniques", SPIE—Optical/Laser Microlithography IV, vol. 1463, pp. 135–150 (1991).

Inoue, S., et al., "Simulation Study on Phase–Shifting Masks for Isolated Patterns", Japanese Journal of Applied Physics, vol. 30, No. 11B, pp. 3010–3015, Nov. 1991.

Watanabe, H., et al., "Detection and Printability of Shifter Defects in Phase–Shifting Masks", Japanese Journal of Applied Physics, vol. 30, No. 11B, pp. 3016–3020, Nov. 1991.

Watanabe, H., et al., "Pattern Transfer Characteristics of Transparent Phase Shifting Mask", Japanese Journal of Applied Physics, vol. 30, No. 11B, pp. 3004–3009, Nov. 1991.

Asai, S., et al., "High Performance Optical Lithography Using a Separated Light Source", J. Vac. Sci. Technol. B, vol. 10, No. 6, pp. 3023–3026, Nov./Dec. 1992.

Fritz, M., et al., "100–nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong–Type PSMs", Hitachi Central Research Lab (8 pages).

Ferguson, R., et al., "Pattern–Dependent Correction of Mask Topography Effects for Alternating Phase–Shifting Masks", IBM Microelectronics, University of California Berkeley (12 pages).

Toublan, O., et al., "Phase and Transmission Errors Aware OPC Solution for PSM: Feasibility Demonstration", Mentor Graphics Corp. (7 pages).

Yanagishita, Y., et al., "Phase–Shifting Photolithography Applicable to Real IC Patterns", Fujitsu Limited (11 pages).

Levenson, M., et al., "Improving Resolution in Photolithography with a Phase–Shifting Mask", IEEE, Transactions On Electron Devices, vol. ED–29, No. 12, pp. 1828–1836, Dec. 1982.

Levenson, M., et al., "The Phase–Shifting Mask II: Imaging Simulations and Submicrometer Resist Exposures", IEEE Transactions on Electron Devices, vol. ED–31, No. 6, pp. 753–763, Jun. 1984.

Terasawa, T., et al., "0.3–Micron Optical Lithography Using a Phase–Shifting Mask", SPIE, Optical/Laser Microlithography II, vol. 1088, pp. 25–33, Mar. 1989.

Nitayama, A., et al., "New Phase Shifting Mask with Self–Aligned Phase Sifters for a Quarter Micron Photolithography", IEDM, pp. 3.3.1–3.3.4, Dec. 3–6, 1989.

Jinbo, H., et al., "0.2um or Less i–Line Lithography by Phase–Shifting–Mask Technology", IEEE, pp. 33.3.1–33.3.4 (1990).

Neureuther, A., "Modeling Phase Shifting Masks", SPIE, 10th Annual Symposium On Microlithography, vol. 1496, pp. 80–85 (1990).

Yamanaka, T., et al., "A 5.9um2 Super Low Power SRAM Cell Using A New Phase–Shift Lithography", IEDM, pp. 18.3.1–18.3.4 (1990).

Inokuchi, K., et al., "Sub–Quarter Micron Gate Fabrication Process Using Phase–Shifting–Mask for Microwave GaAs Devices", Extended Abstracts Of The 1991 Intl. Conference On Solid State Devices And Materials, Yokohama, Japan, pp. 92–94 (1991).

Inokuchi, K., et al., "Sub–Quarter–Micron Gate Fabrication Process Using Phase–Shifting Mask for Microwave GaAs Devices", Japanese Journal Of Applied Physics, vol. 30, No. 12B, pp. 3818–3821, Dec. 1991.

Rhyins, P., et al., "Characteristics of Quartz Etched PSM Masks for KrF Lithography at the 100nm Node", Photronics, Inc., MIT Lincoln Lab, ARCH Chemicals, Finle Technologies, KLATencor Corp. (10 pages).

Ronse, K., et al., "Thin Film Interference Effects in Phase Shifting Masks Causing Phase and Transmittance Errors", IMEC (15 pages).

Rosenbluth, A., et al., "Optimum Mask and Source Patterns to Print a Give Shape", IBM (17 pages).

Sakata, M., et al., "A Novel Radiation Sensitive Spin–on–Glass Convertible into SiO2 and the Simple Fabrication Process Using It", Oki Electric Industry Co. Ltd. (3 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase–Shift Mask Designs Including Defocus Effects", AMD, Princeton University, Vecor Technologies Inc. (8 pages).

Suzuki, A., et al., "Multilevel Imaging System Realizing k1=–.3 Lithogrpaby", Canon Inc. (13 pages).

Vandenberghe, G., et al., "(Sub–)100nm Gate Patterning Using 248nm Alternating PSM", IMEC, Mentor Graphics (9 pages).

Wang, R., et al., "Polarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase–Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Ackmann, P., et al., "Phase Shifting and Optical Proximity Corrections to Improve CD Control on Logic Devices in Manufacturing for Sub 0.35 um 1–Line", SPIE, vol. 3051, pp. 146–153, Mar. 12–14, 1997.

Matsuoka, K., et al., "Application of Alternating Phase–Shifting Mask to 0.16um CMOS Logic Gate Patterns", Matushita Electric Ind. Co., Ltd. (9 pages).

Spence, Co., et al., "Detection of 60(degree) Phase Defects on Alternating PSMs", Advanced Micro Devices, KLA–Tencor, DuPont RTC (2 pages).

Sugawara, M., et al., "Defect Printability Study of Attenuated Phase–Shifting Masks for Specifying Inspection Sensitivity", Sony Corporation, Kanagawa, Japan (16 pages).

Erdmann, A., "Topography Effects and Wave Aberrations in Advanced PSM–Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase–Shifting Mask with Highly Transparent SiO2 Phase Shifters", Fujitsu Laboratories Ltd. (11 pages).

Ishiwata, N., et al., "Fabrication of Phase–Shifting Mask", Fujitsu Limited (11 pages).

Levenson, M., et al., "Phase Phirst! An Improved Strong–PSM Paradigm", M.D. Levenson Consulting, Petersen Advanced Lithography, KLA–Tencor (10 pages).

Levenson, M., et al., "SCAA Mask Exposures and Phase Phirst Design for 110nm and Below", M.D. Levenson Consulting, Canon USA, Inc., ISR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm–alt.PSM Structure Discussion for ArF Lithography", Dai–Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

* cited by examiner

DESIGN

PRINTED IMAGE

LINE END SHORTENING AND PULLBACK

ALLEVIATING LINE END SHORTENING BY EXTENDING PHASE SHIFTERS

RELATED APPLICATION

This application is a continuation of, and hereby claims priority under 35 U.S.C.§ 120 to, U.S. patent application Ser. No. 09/872,620, filed 31 May 2001 now U.S. Pat. No. 6,553,560, entitled "Alleviating Line End Shortening in Transistor Endcaps by Extending Phase Shifters" by inventors Melody W. Ma and Hua-Yu Liu, which claims priority to U.S. Provisional Patent Application No. 60/281,325 filed on 3 Apr. 2001, entitled "Using Double Exposure Effects During Phase Shifting To Control Line End Shortening" by inventors Michael E. Kling and Hua-Yu Liu.

BACKGROUND

1. Field of the Invention

The invention relates to the process of fabricating semiconductor chips. More specifically, the invention relates to a method and an apparatus that extends phase shifters to alleviate line end shortening and provide better gate critical dimension control during an optical lithography process for manufacturing an integrated circuit.

2. Related Art

Recent advances in integrated circuit technology have largely been accomplished by decreasing the feature size of circuit elements on a semiconductor chip. As the feature size of these circuit elements continues to decrease, circuit designers are forced to deal with problems that arise as a consequence of the optical lithography process that is typically used to manufacture integrated circuits. This optical lithography process generally begins with the formation of a photoresist layer on the surface of a semiconductor wafer. A mask composed of opaque regions, which are generally formed of chrome, and light-transmissive clear regions (chromeless), which are generally formed of quartz, is then positioned over this photoresist coated wafer. (Note that the term "mask" as used in this specification is meant to include the term "retical.") Light is then shone on the mask from a visible light source or an ultraviolet light source.

This light is generally reduced and focused through an optical system that contains a number of lenses, filters and mirrors. The light passes through the clear regions of the mask and exposes the underlying photoresist layer. At the same time, the light is blocked by opaque regions of mask, leaving underlying portions of the photoresist layer unexposed.

The exposed photoresist layer is then developed, typically through chemical removal of the exposed/non-exposed regions of the photoresist layer. The end result is a semiconductor wafer with a photoresist layer having a desired pattern. This pattern can then be used for etching underlying regions of the wafer.

One problem that arises during the optical lithography process is "line end shortening" and "pullback" caused by optical effects. For example, the upper portion of FIG. 1 illustrates a design of a transistor with a polysilicon line 102, running from left to right, that forms a gate region used to electrically couple an upper diffusion region with a lower diffusion region. The lower portion of FIG. 1 illustrates the actual printed image that results from the design.

Note that because of optical effects and resist pullback there is a significant amount of line end shortening. This line end shortening is due to optical effects that cause the light to expose more of the resist under a line end than under other portions of the line.

Note that polysilicon line 102 has been narrowed using optical phase shifting in order to improve the performance of the transistor by reducing the resistance through the gate region. Phase shifters are often incorporated into a mask in order to achieve line widths that are smaller than the wavelength of the light that is used to expose the photoresist layer through the mask. During phase shifting, the destructive interference caused by two adjacent clear areas on a mask is used to create an unexposed area on the photoresist layer. This is accomplished by exploiting the fact that light passing through a mask's clear regions exhibits a wave characteristic having a phase that is a function of the distance the light travels through the mask material. By placing two clear areas adjacent to each other on the mask, one of thickness $t_1$ and the other of thickness $t_2$, one can obtain a desired unexposed area on the underlying photoresist layer caused by interference. By varying the thickness $t_1$ and $t_2$ appropriately, the light exiting the material of thickness $t_2$ is 180 degrees out of phase with the light exiting the material of thickness $t_1$. Phase shifting is described in more detail in U.S. Pat. No. 5,858,580, entitled "Phase Shifting Circuit Manufacture Method and Apparatus," by inventors Yao-Ting Wang and Yagyensh C. Pati, filed Sep. 17, 1997 and issued Jan. 12, 1999, which is hereby incorporated by reference.

In order to compensate for line end shortening, designers often add optical proximity correction (OPC) features, such as "hammer heads," onto line ends. For example, in FIG. 2A, a hammerhead 215 is added onto an endcap 216 of a transistor in order to reduce the problem of line end shortening in some situations. However, note that hammerhead 215 may give rise the design rule violations that can potentially cause bridging between the hammerhead and polysilicon line 202.

This bridging problem can be alleviated by introducing a separation between hammerhead 215 and polysilicon line 202. However, introducing such a separation increases the size of the circuit element, which means that fewer circuit elements can be integrated into a semiconductor chip.

What is needed is a method and an apparatus for mitigating the line end shortening problem in transistor endcaps, while reducing the impact of OPC features, such as hammerheads.

SUMMARY

One embodiment of the invention provides a system and a method for reducing line end shortening and improved gate critical dimension control during an optical lithography process for manufacturing an integrated circuit. The system operates by receiving a specification of the integrated circuit, wherein the specification defines transistors that include gates. Next, the system identifies a gate within the specification, wherein the gate includes an endcap that is susceptible to line end shortening during the optical lithography process. The system then extends a phase shifter used to form the gate, so that the phase shifter defines at least a portion of the endcap and thereby reduces line end shortening of the endcap due to optical effects.

In one embodiment of the invention, extending the phase shifter involves extending the phase shifter past the endcap.

In one embodiment of the invention, extending the phase shifter involves extending the phase shifter so that it covers at least part of the endcap, but does not extend past the endcap. In a variation on this embodiment, the phase shifter extends past the endcap.

In one embodiment of the invention, the system automatically checks design rules that specify a minimum distance between the phase shifter and other structures within the integrated circuit.

In one embodiment of the invention, the system additionally marks the endcap to prevent subsequent optical proximity correction (OPC) of the endcap. In a variation on this embodiment, the system subsequently applies OPC to the layout, without applying OPC to endcaps that have been marked.

In one embodiment of the invention, if the endcap has been modified through optical proximity correction (OPC), the system replaces the modified endcap with an (ideal) unmodified endcap.

In one embodiment of the invention, if the endcap is not straight, the system replaces the endcap with a straight endcap.

DETAILED DESCRIPTION

Extended Phase Shifter

Figure 1:
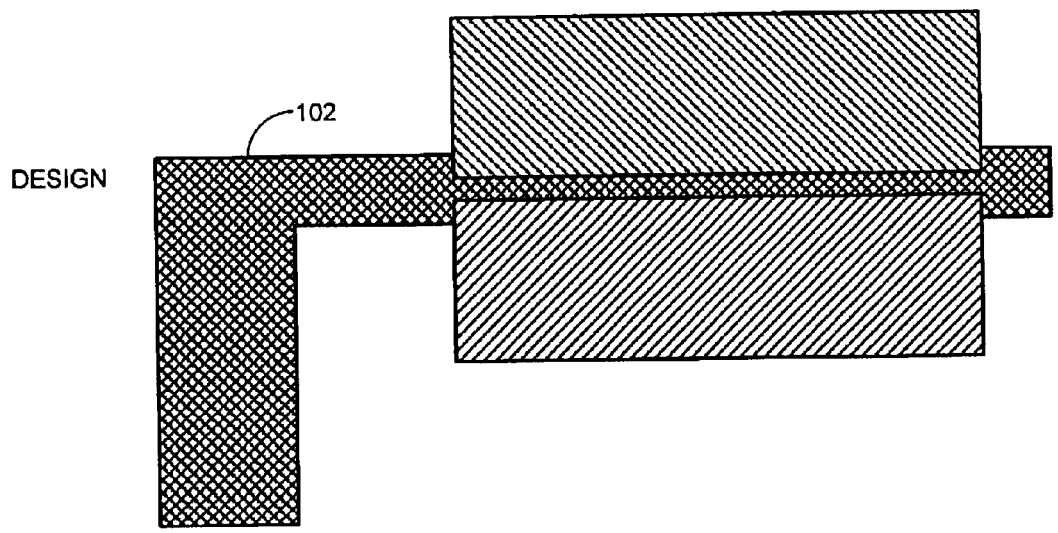
FIG. 1 illustrates the line end shortening problem.
Figure 1:
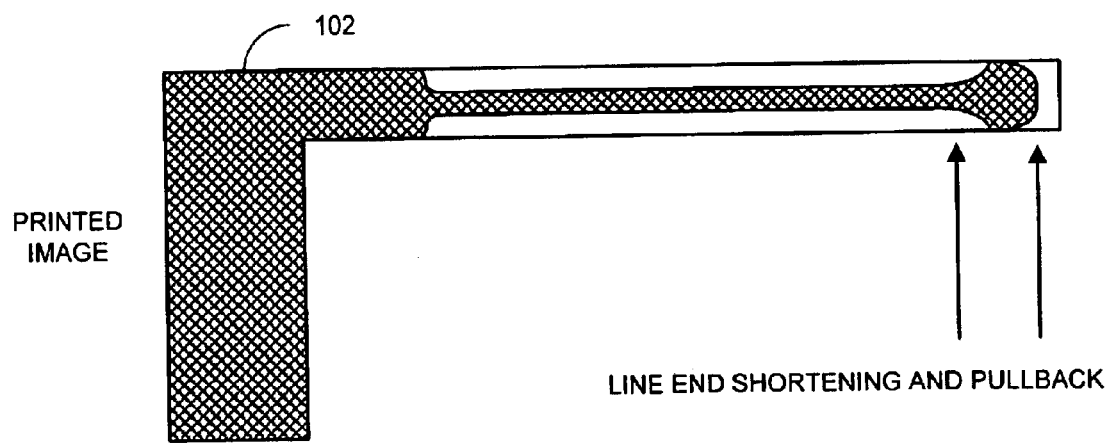
Figure 2A:
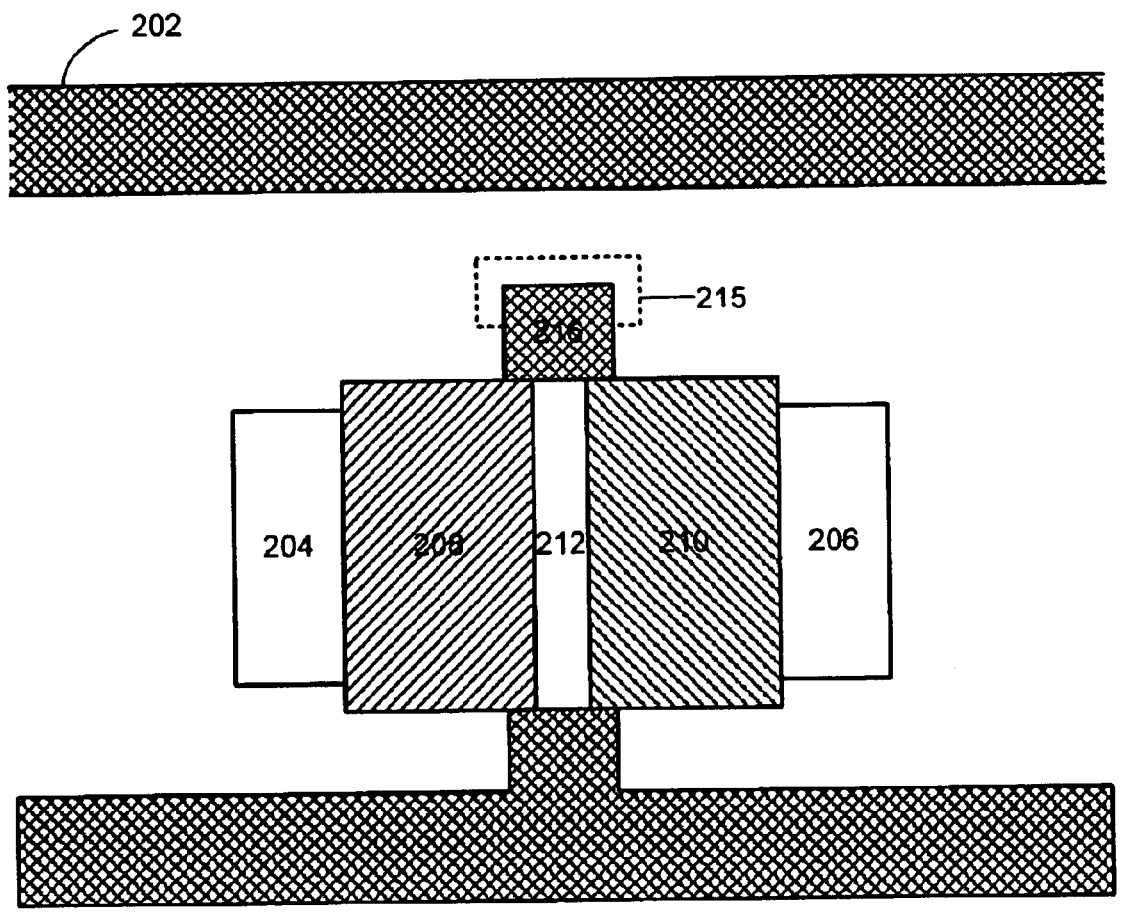
FIG. 2A illustrates the use of a hammerhead to compensate for the line end shortening problem.
Figure 2B:
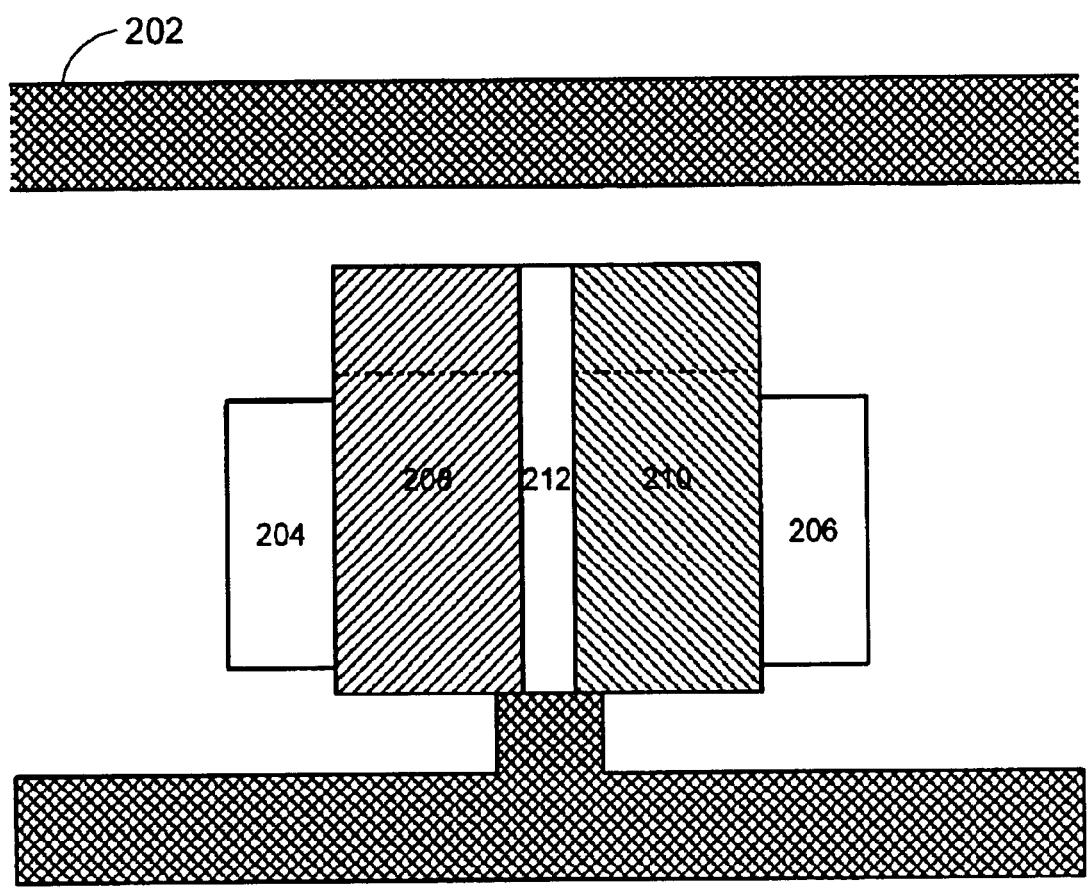
FIG. 2B illustrates the use of an extended phase shifter to alleviate the line end shortening problem in accordance with an embodiment of the invention.

FIG. 2B illustrates the use of an extended phase shifter to alleviate the line end shortening problem in accordance with an embodiment of the invention. The circuit layout in FIG. 2B is the same as the circuit layout FIG. 2A, except that the phase shifter comprised of, zero-degree clear region 208, chromium regulator 212 and 180-degree clear region 210, has been extended so that it covers at least part of endcap 216 (illustrated in FIG. 2A).

This alleviates the optical line end shortening problem for endcap 216 because the destructive interference of the phase shifter lessens the incidental exposure problem that causes the line end shortening around endcap 216.

Note that the phase shifter may extend past endcap 216 if the phase shifter does not interfere with other features in the circuit. Otherwise, the phase shifter may extend to cover at least part of endcap 216, but not past endcap 216, so that the phase shifter defines at least a portion of the boundary of endcap 216.

Note that by extending the phase shifter in this way, OPC features such as hammerhead 215 are no longer required. Hence, the potential design rule violations caused by these OPC features can be avoided.

Endcap Replacement

Figure 3:
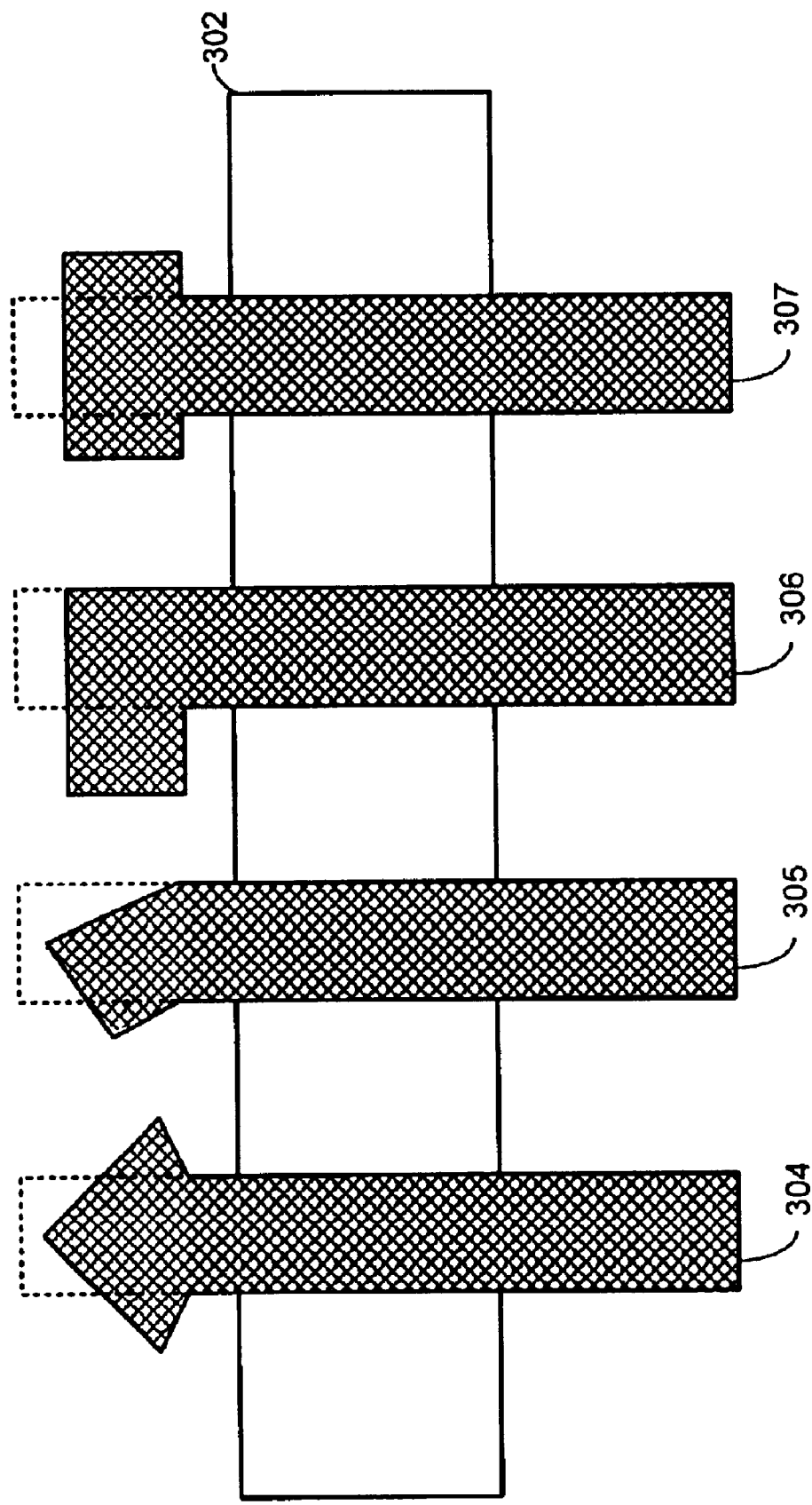
FIG. 3 illustrates the replacement of endcaps that are not straight or endcaps that have been modified with straight unmodified endcaps in accordance with an embodiment of the invention.

FIG. 3 illustrates the replacement of endcaps that are not straight or endcaps that have been modified with straight unmodified endcaps in accordance with an embodiment of the invention. In FIG. 3, a number of polysilicon lines 304–307 form a set of pass transistors in active diffusion region 302. Some of these polysilicon lines, such as polysilicon lines 304 and 307, have endcaps with OPC features that are become unnecessary if there exists an extended phase shifter. Other polysilicon lines, 305 and 306, are not straight.

When an extended phase shifter is used to form the endcaps in polysilicon lines 304–307, the OPC features and non-straight endcaps become unnecessary. Consequently, these endcaps are replaced by unmodified straight endcaps as is illustrated by the dotted lines in FIG. 3.

Wafer Fabrication Process

Figure 4:
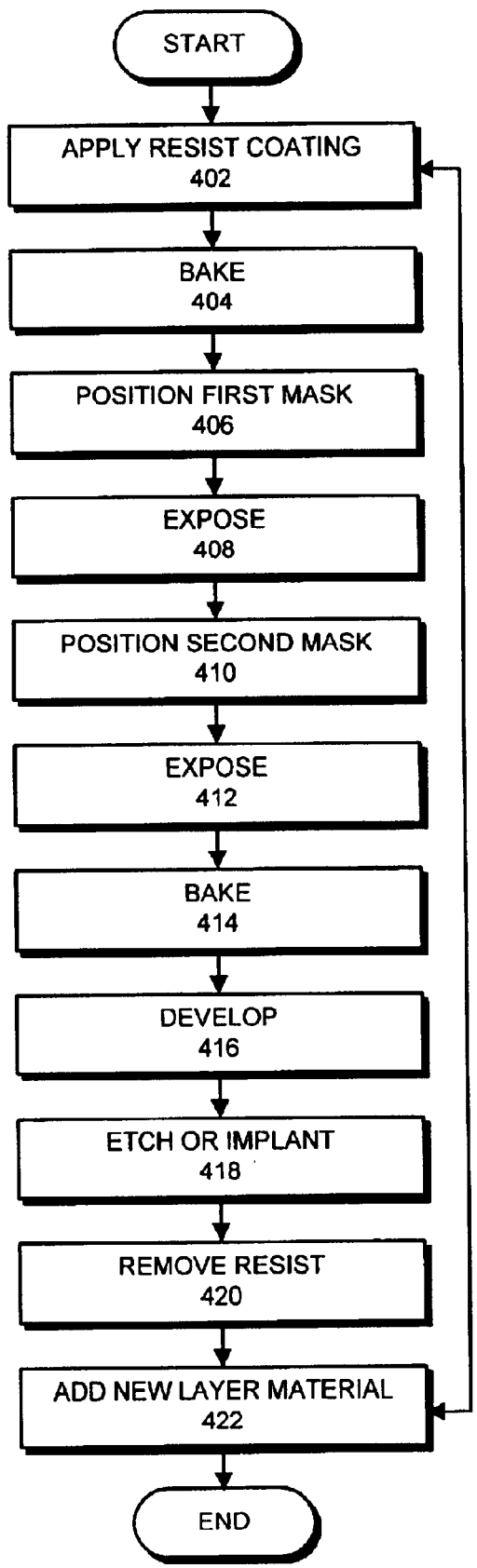
FIG. 4 is a flow chart illustrating the wafer fabrication process in accordance with an embodiment of the invention.

FIG. 4 is a flow chart illustrating the wafer fabrication process in accordance with an embodiment of the invention. The system starts by applying the resist coating to the top surface of a wafer (step 402). Next, the system bakes the resist layer (step 404). The system then positions the first mask over the photoresist layer (step 406), and then exposes the photoresist layer through the first mask (step 408). Next, the system positions the second mask over the photoresist layer (step 410), and then exposes the photoresist layer through the second mask (step 412). Note that the first mask and/or the second mask may include phase shifters.

The system then bakes the wafer again (step 414) before developing the photoresist layer (step 416). Next, either a chemical etching or ion implantation step takes place (step 418) before the photoresist layer is removed (step 420). Finally, a new layer of material can be added and the process can be repeated for the new layer (step 422).

Process of Extending a Phase Shifter

Figure 5:
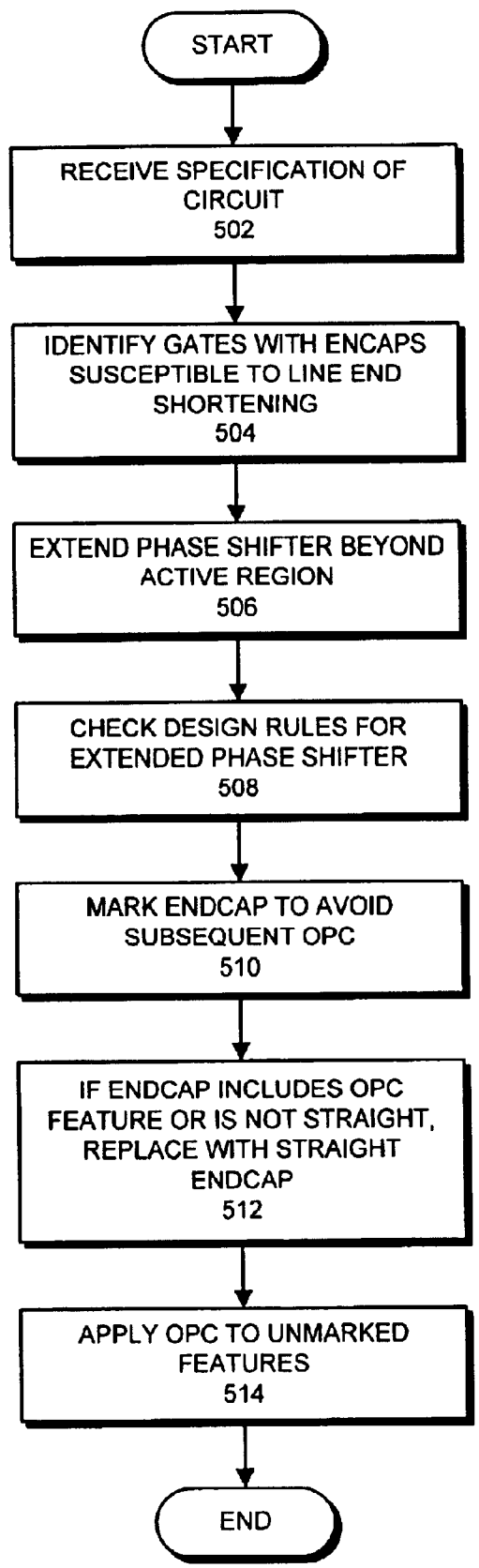
FIG. 5 is a flow chart illustrating the process of extending a phase shifter to alleviate the line end shortening problem for a transistor endcap in accordance with an embodiment of the invention.

FIG. 5 is a flow chart illustrating the process of extending a phase shifter to alleviate the line end shortening problem for a transistor endcap in accordance with an embodiment of the invention. The process starts when the system receives a specification of the circuit in some format, such as GDSII stream format (step 502). Next, the system identifies gates within transistors that have endcaps that the designer desires to apply phase shifting to, and that are susceptible to line end shortening problems (step 504).

For these identified gates, the system extends phase shifters beyond the active region, for example in FIG. 2B past active diffusion regions 204 and 206 (step 506). Note that this may involve extending the phase shifter beyond the endcap, which in some cases is preferable, or alternatively, extending the phase shifter to cover part or all of the endcap without extending beyond the endcap. Also note that in one embodiment of the invention, extended phase shifters can be inserted into areas that were not originally targeted for phase shifting in order to alleviate the line end shortening problem.

Next, the system checks design rules to ensure that there exists a pre-specified minimum distance between the extended shifter and other polysilicon features in the circuit (step 508). If a design rule violation is detected, an error can be generated, and corrective action can be taken by either modifying the polysilicon feature or by modifying the extended shifter.

The system also marks the identified endcaps to ensure that the endcaps are not modified during a subsequent OPC process (step 510).

Additionally, if an identified endcap has been modified to include an OPC feature or if the endcap is not straight, the endcap can be replaced with a unmodified straight endcap as is illustrated in FIG. 3 (step 512).

Finally, an additional OPC process can be applied to unmarked features within the specification of the circuit (step 514).

The preceding description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the invention. Thus, the invention is not intended to be limited to the embodiments shown, but is to be accorded the widest scope consistent with the principles and features disclosed herein.

The data structures and code described in this detailed description are typically stored on a computer readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

The foregoing descriptions of embodiments of the invention have been presented for purposes of illustration and description only. They are not intended to be exhaustive or to limit the invention to the forms disclosed. Accordingly, many modifications and variations will be apparent to practitioners skilled in the art. Additionally, the above disclosure is not intended to limit the invention. The scope of the invention is defined by the appended claims.

What is claimed is:

1. A method for compensating for line end shortening during an optical lithography process for manufacturing an integrated circuit, comprising:
   receiving a specification for the integrated circuit;
   identifying a line end within the specification that includes modifications to endcaps that were generated during an optical proximity correction process to compensate for line end shortening;
   reducing the modifications generated during the optical proximity correction process; and
   using a phase shifter to define at least a portion of the line end, thereby compensating for the line end shortening, wherein using the phase shifter involves extending the phase shifter past the line end.

2. The method of claim 1, wherein extending the phase shifter involves extending the phase shifter so that it covers at least part of the line end, but does not extend past the line end.

3. The method of claim 1, further comprising automatically checking design rules that specify a minimum distance between the phase shifter and other structures within the integrated circuit.

4. The method of claim 1, wherein reducing the modifications generated during the optical proximity correction process involves completely removing the modifications.

5. The method of claim 1, wherein reducing the modifications generated during the optical proximity correction process involves removing some, but not all of the modifications.

6. The method of claim 1, wherein using the phase shifter to define at least a portion of the line end involves extending an existing phase shifter that defines a portion of an associated line so that the existing phase shifter defines at least a portion of the line end.

7. The method of claim 1, wherein if the line end is not straight, the method further comprises replacing the line end with a straight line end.

8. A computer-readable storage medium storing instructions that when executed by a computer cause the computer to perform a method for compensating for line end shortening during an optical lithography process for manufacturing an integrated circuit, the method comprising:
   receiving a specification for the integrated circuit;
   identifying a line end within the specification that includes modifications to endcaps that were generated during an optical proximity correction process to compensate for line end shortening;
   reducing the modifications generated during the optical proximity correction process; and
   using a phase shifter to define at least a portion of the line end, thereby compensating for the line end shortening, wherein using the phase shifter involves extending the phase shifter past the line end.

9. The computer-readable storage medium of claim 8, wherein extending the phase shifter involves extending the phase shifter so that it covers at least part of the line end, but does not extend past the line end.

10. The computer-readable storage medium of claim 8, wherein the method further comprises automatically checking design rules that specify a minimum distance between the phase shifter and other structures within the integrated circuit.

11. The computer-readable storage medium of claim 8, wherein reducing the modifications generated during the optical proximity correction process involves completely removing the modifications.

12. The computer-readable storage medium of claim 8, wherein reducing the modifications generated during the optical proximity correction process involves removing some, but not all of the modifications.

13. The computer-readable storage medium of claim 8, wherein using the phase shifter to define at least a portion of the line end involves extending an existing phase shifter that defines a portion of an associated line so that the existing phase shifter defines at least a portion of the line end.

14. The computer-readable storage medium of claim 8, wherein if the line end is not straight, the method further comprises replacing the line end with a straight line end.

15. A means for compensating for line end shortening during an optical lithography process for manufacturing an integrated circuit, comprising:
   a receiving means for receiving a specification for the integrated circuit;
   an identification means for identifying a line end within the specification that includes modifications to endcaps that were generated during an optical proximity correction process to compensate for line end shortening;
   a reducing means for reducing the modifications generated during the optical proximity correction process; and
   a phase shifting means for using a phase shifter to define at least a portion of the line end, thereby compensating for the line end shortening, wherein using the phase shifter involves extending the phase shifter past the line end.

16. The means of claim 15, further comprising a design rule checking means for automatically checking design rules that specify a minimum distance between the phase shifter and other structures within the integrated circuit.

17. A semiconductor structure within an integrated circuit created through a process that compensates for line end shortening during an optical lithography process for manufacturing an integrated circuit, the process comprising:
   receiving a specification for the integrated circuit;
   identifying a line end within the specification that includes modifications to endcaps that were generated during an optical proximity correction process to compensate for line end shortening;

reducing the modifications generated during the optical proximity correction process; and using a phase shifter to define at least a portion of the line end, thereby compensating for the line end shortening, wherein using the phase shifter involves extending the phase shifter past the line end.

18. A mask for use in fabricating an integrated circuit created through a process that compensates for line end shortening during an optical lithography process for manufacturing an integrated circuit, the process comprising:

receiving a specification for the integrated circuit;

identifying a line end within the specification that includes modifications to endcaps that were generated during an optical proximity correction process to compensate for line end shortening;

reducing the modifications generated during the optical proximity correction process; and using a phase shifter to define at least a portion of the line end, thereby compensating for the line end shortening, wherein using the phase shifter involves extending the phase shifter past the line end.

* * * * *